United States Patent [19]

Felten et al.

[11] Patent Number: 5,744,285
[45] Date of Patent: Apr. 28, 1998

[54] COMPOSITION AND PROCESS FOR FILLING VIAS

[75] Inventors: John James Felten, Chapel Hill; Stephan Padlewski, Raleigh, both of N.C.

[73] Assignee: E. I. du Pont de Nemours and Company, Wilmington, Del.

[21] Appl. No.: 683,351

[22] Filed: Jul. 18, 1996

[51] Int. Cl.$^6$ .................................................. G03C 5/00
[52] U.S. Cl. .......................... 430/318; 430/326; 430/325; 430/331
[58] Field of Search ....................... 430/318, 313, 430/327, 330, 331, 325, 326

[56] References Cited

U.S. PATENT DOCUMENTS 3,971,610 7/1976 Buchoff et al. ..................... 339/17 R
3,989,644 11/1976 Bolon et al. ....................... 252/514
4,827,083 5/1989 Inasaka et al. .................... 174/68.5
5,386,627 2/1995 Booth et al. ....................... 29/852

FOREIGN PATENT DOCUMENTS 4-196290 7/1992 Japan .
6-104545 4/1994 Japan .

Primary Examiner—Janet C. Baxter
Assistant Examiner—Rosemary Ashton

[57] ABSTRACT

Electrolytic and electroless processes which use a solid plug of polymer thick film composition to fill throughholes and composition therefor. The composition comprises a trimodal conductive mixture dispersed in an organic vehicle wherein the trimodal conductive mixture consists of particles of spherical silver, flake silver and silver-coated copper.

3 Claims, 2 Drawing Sheets

COMPOSITION AND PROCESS FOR FILLING VIAS

FIELD OF THE INVENTION

The present invention is directed to a thick film paste and a process for filling through holes or vias on printed wiring boards (PWB).

BACKGROUND OF THE INVENTION

The multilayer printed wiring board industry is continuously searching for improved methods of connecting one circuit layer to another. In the most common method, through holes (vias) are first drilled through the PWB or laminate layer. Then the sides of the through holes are activated to accept plating resulting in plated though holes. More recently, a segment of the industry has coated the sides of the through holes with a polymer thick film paste, which is then dried and forms conductive paths through the via. Through hole printing has the advantages of being simpler and cheaper, with the disadvantages of being higher in resistivity and less reliable.

As PWB circuit density increases, there is increasing interest in alternatives to current techniques of interconnecting by means of double sided and inner layer through holes. The existence of voids where vias exist is a disadvantage of the drill/plate process, which uses "tented" photoresist to prevent subsequent etch steps from removing the copper plating in the through hole. The void-containing through holes are capable of causing hot spots in circuits that must dissipate significant amounts of heat. Entrapped air is also a potential source of blisters during high temperature processes such as soldering. The high resistivity and reduced reliability of commonly used polymer thick film pastes that coat the sides of the through holes is reason to pursue low cost alternatives.

A great deal of interest, therefore, exists in through holes filled with solid conductive via plugs of printed/cured polymer thick film paste. The added material potentially provides better resistivity than the existing polymer thick film paste which coats the through hole. The solid conductive via plugs also provide a potentially more reliable interface between the thick film paste and the plated PWB traces than printed through holes. This invention encompasses materials and processes that provide a low cost alternative to current industry practice.

A number of approaches have been tried in the search for a reliable process and composition that uses a solid plug of polymer thick film paste to fill the through hole. References most similar to our invention are described hereinbelow.

Japanese 6-104545 to Kawakita, Tsukamoto, Horio, Nakatani, and Hatakeyama disclose a process whereby particles larger in diameter than the board thickness are inserted into through holes and bonded to copper foil with heat and pressure. Japanese 4-196290 to J. Kojima describes a solid via plug used in multilayer PWB boards. However, this technique uses a thick (20–30 micron) panel plating of copper over the vias in order to make reliable contact; the paste shrinks below the surface of the board during drying/curing. This process presumably uses an activation step, then an electroless plating step, and finally an electroplating step over the whole panel. The present invention offers a faster, cheeper solid plug process coupled with reliability. In addition the present invention offers a novel paste for use as a solid plug which provides high conductivity, ease of application, low shrinkage during drying and cure, and good mechanical strength.

SUMMARY OF THE INVENTION

The invention is directed to a via fill composition comprising a trimodal conductive mixture dispersed in an organic vehicle wherein the trimodal conductive mixture consists of particles of spherical silver, flake silver and silver-coated copper.

The invention is also directed to an electrolytic method for forming electrically conductive vias between electrically functional layers separated by a dielectric layer comprising the sequential steps:

A. Forming via holes in a copper-clad substrate which separates electrically functional layers;
B. Filling the via holes with the via fill composition of claim 1;
C. Drying the composition to effect volatilization of the solvent;
D. Removing residue from the surface of the substrate;
E. Subjecting the filled substrate to heat;
F. Preparing the surface of the filled substrate for plating;
G. Plating the filled substrate by electrolytic flash;
H. Preparing the surface of the plated substrate;
I. Applying a photoresist to the prepared substrate;
J. Exposing the photoresist to generate a pattern;
K. Developing and removing the exposed photoresist;
L. Etching the exposed copper;
M. Stripping the remaining photoresist from the copper.

The invention is further directed to an electroless method for forming electrically conductive vias between electrically functional layers separated by a dielectric layer comprising the sequential steps:

A. Forming via holes in a copper-clad substrate which separates electrically functional layers;
B. Filling the via holes with a via fill composition of claim 1;
C. Drying the composition to effect volatilization of the solvent;
D. Removing residue from the surface of the filled substrate;
E. Subjecting the filled substrate to heat;
F. Preparing the surface of the plated substrate;
G. Applying a photoresist to the prepared substrate;
H. Exposing the photoresist to generate a pattern;
I. Developing and removing the exposed photoresist;
J. Etching the exposed copper;
K. Stripping the remaining photoresist to bare the remaining copper;
L. Plating the surface of the bared copper by electroless plating.

DETAILED DESCRIPTION OF THE INVENTION

Figure 1A:
FIG. 1 shows a schematic of a process depicting the use of a conductive via plug with electrolytic panel plating step.

The present invention is first directed to a material which possesses very low shrinkage during drying/curing, high conductivity, and strength during drilling and machining. The conductive particles of the composition are chosen by giving consideration to optimizing particle packing. Therefore, a large particle size as one component of the conductive phase is desirable to prevent small cracks which cause high resistance and open circuits in vias. It has been found that the larger the vias, the more important the large particle size component. In the preferred mode the composition comprises a trimodal conductive mixture of spherical and flake silver, combined with large silver coated copper, although the invention may comprise a bimodal conductive mixture of flake silver and large silver coated copper. As used herein "trimodal" means three phases of conductive particles. Also, the large silver coated copper may be replaced by large pure silver particles but this would increase cost considerably. The silver coated copper particles are coated with about 2–3μ of silver and the mean diameter of the particle is about 15–50μ (mean diameter 45 microns in preferred mode). The flake diameter is about 3–10μ (about 5μ in preferred mode) and the preferred spherical diameter is about 2–5μ (about 3μ in preferred mode). The solids levels are approximately about 85–93% by weight total composition, with about 15–7% (wt.) organic vehicle. The preferred solids levels are approximately about 89–92% by weight total composition, with about 8–12% (wt.) organic vehicle. It was found that the higher the solids level of conductive phase the higher the conductivity up to about 92% (wt.). Also, the trimodal mixture prevents settling of the metal powder in the paste. The conductive particles are mixed with an organic vehicle by mechanical mixing (e.g., on a roll mill) to form a paste-like composition having suitable consistency and rheology for screen printing. The main purpose of the vehicle is to serve as a medium for dispersion of the conductive particles. Thus, the vehicle must first be one in which the solids are dispersible with an adequate degree of stability. Secondly, the rheological properties of the vehicle must be such that they lend good application properties to the composition.

In a preferred embodiment the silver coated copper comprises about 15–25 wt. percent of the conductive phase, with a more preferred range of about 20 wt. percent, with the remainder of the conductive phase divided about equally between spherical and flake silver. It is believed that in vias less than 30 mils deep the large silver coated copper may not be necessary to prevent cracking while maintaining conductivity. A wide variety of polymeric materials can be used as the main component of the vehicle. Potential resin systems should have a high Tg, a low Young's modulus, to aid in compressing the metal powder during cure, and low shrinkage during cure. The polymer should withstand short exposure to the high temperatures encountered during solder operations. The polymer preferably will crosslink during cure, so that the uncured vehicle can have low viscosity— i.e. low MW in uncured form. This will permit a high loading of conductive phase while maintaining a relatively low viscosity suitable for printing. The polymer should be resistant to silver migration, it should thin readily to permit viscosity adjustment while permitting high metal loading; also, compatible plasticizers should be available to import greater flexibility to brittle cross-linked structures. Epoxy resins and acrylates are utilized in the invention, although the preferred embodiment consists of bisphenol A or bisphenol F, with granulated dicyanamide crosslinker, and a curing accelerator. To achieve the proper resin loading in the cured conductor, the vehicle is diluted with the preferred diethyleneglycol dibutyl ether.

Since the solvent is volatile in via fill formulations, the system reduces in volume as the solvent evaporates. This tends to promote voids and cracks in the body of via fill and at the edge of the via. The use of solvent must, therefore, be minimized. This is very different from the case with standard screen printed conductors. One alternative to the use of solvent is the addition of a plasticizer, monomer or oligomer to the formulation in place of some of the resin and solvent. This reduces the viscosity, since a portion of the high viscosity component of the vehicle is replaced with relatively low viscosity material that forms part of the crosslinked structure when the vehicle is thermally cured.

The present invention utilizes another means to reduce the volume decrease that occurs as solvent evaporates from the paste. The flake silver in the formulation orients so that the volume of the system minimizes when it is under shear. As the material is dried at elevated temperature, there is some randomization of the flakes, effectively increasing their volume. This partially offsets the shrinkage due to solvent evaporation.

The invention is further directed to a new process which utilizes the conductive paste. The process yields highly conductive, reliable two sided or multilayer printing wiring boards (PWB). As used herein, the conductive paste will be referred to as "conductive via plug". The conductive via plug is used as a building block to connect electrically functional inner-layers (buried vias), the traces on opposite sides of inner layers of multilayer PWB boards, and also double sided PWB boards. The process may be applied to both rigid and flexible substrates.

The present composition uses higher solids loading in polymer thick film (PTF) conductors then conventional pastes which increases the density of particle-particle contact. It also uses large particulates where possible to increase the distance the current is carried by individual particles thus reducing the number of particle-particle contacts. These large conductive particles also permit higher loading of conductive phase in the relatively low organic solids phase. These approaches, combined with the short distances needed between circuit layers to establish interconnection, and the large solid cross section of the vias, have produced interconnects with suitably low resistance for via interconnect applications. This invention is, therefore, a combination of PWB and PTF materials and process technology resulting in a hybrid approach, combining the advantages of thick film ceramic and PWB interconnect technology married in a novel way to produce interconnects in printed wiring boards.

Figure 1B:
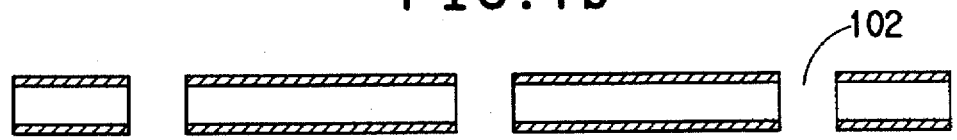
Figure 1C:
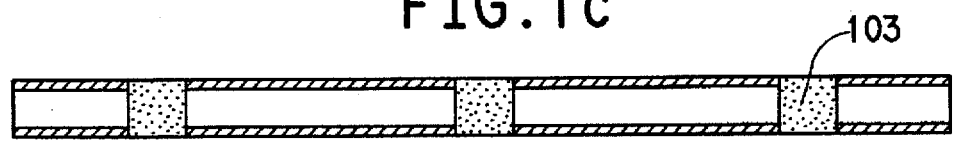
Figure 1D:
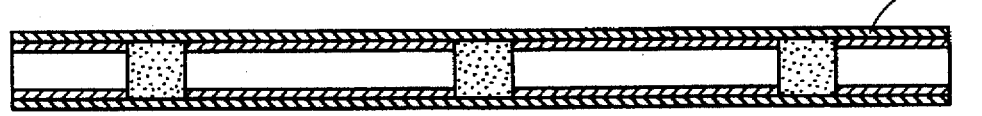
Figure 1E:
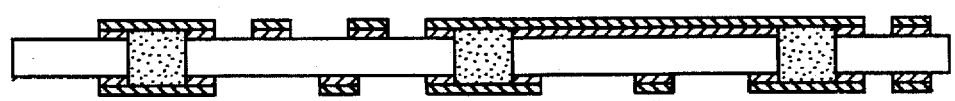

The process may be employed with a electrolytic or electroless plating step. First, the electrolytic process will be discussed with reference to FIG. 1.

(FIG. 1a) The starting substrate can involve copper clad on FR-4, polyimide, cyanate ester, and more generally on reinforced or unreinforced dielectric substrate (101) separating electrically functional layers.

(FIG. 1b) The substrate is then drilled with a desired pattern (102).

(FIG. 1c) Conductive via plugs are applied by conventional methods, such as, selective screen printing, stenciling, doctor blading, syringe, bladder printing or directly into the through hole and onto the copper surface or any other means of application (103). A drying step follows to remove volatile components and make the uncured via fill composition more rigid. This enables the composition to stay in the vias. Electrical continuity is needed to ensure current flow over the plug, and ensures plating over. After drying, residues left on the surface may be removed by a scrubbing step.

The scrubbing step removes vehicle at the surface of the conductive particles found in the plug and ensures good electrical contact. This lapping or scrubbing step has an additional purpose aside from eliminating the excess plug residue on the surface, it, also, activates the surface by smearing the soft silver particles. The smearing step yields satisfactory platability. An additional desmearing step may be used to further enhance platability. This allows electroplating over the plug. A cure step is then required to cross-link the organic vehicle and further eliminate the residual solvent. After cure, the shrinkage is small so that the conductive plug remains in contact with the thin copper foil.

(FIG. 1d) The electrical contact with the conductive copper layers is then enhanced by an electrolytic plating flash (104) of about 200 to 500 micro inches. This process eliminates the industry's current practice of a need for a step of palladium activation and a further step of electroless Cu plating.

(FIG. 1e) Conventional print & etch process steps are then required to complete the formation of the expand circuit. The print and etch steps are typically surface preparation to receive a photoresist, photoresist application, exposing the photoresist with either a positive or negative pattern, developing the photoresist to remove excess resist material leaving only the desired pattern on the substrate, etching the exposed areas of copper from the substrate, leaving behind only those areas of copper protected by the photoresist and stripping the remaining photoresist from the remaining copper, thereby leaving behind the desired pattern in the form of a copper pattern.

Figure 2A:
FIG. 2 shows a schematic of a process depicting the use of a conductive via plug with the electroless pattern plating. Instead of panel electroplating as shown in FIG. 1 a step is shown for printing and etching the board and then selectively electroless plate the circuit along the plugs (205).
Figure 2B:
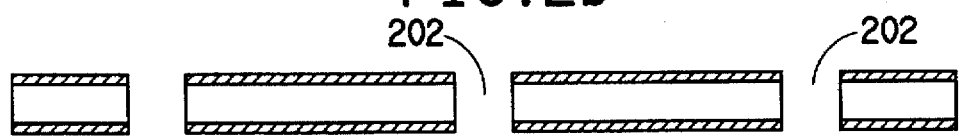
Figure 2C:
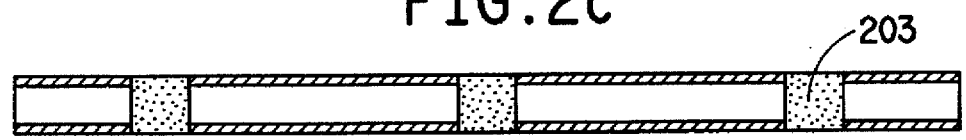
Figure 2D:
Figure 2E:
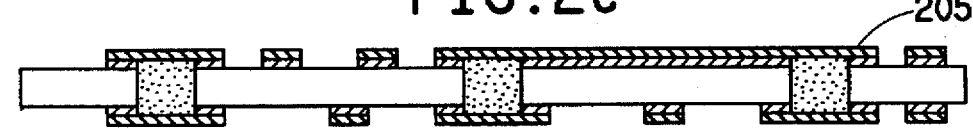

The electroless plate process is discussed with reference to FIG. 2a–e.

(FIG. 2a) The starting substrate can involve copper clad on FR-4, polyimide, cyanate ester, and more generally on reinforced or unreinforced dielectric substrate (201).

(FIG. 2b) The substrate is then drilled with a desired pattern (202).

(FIG. 2c) Conductive via plugs are applied by conventional methods, such as, selective screen printing, stenciling, doctor blading, syringe, bladder printing or directly into the through hole and onto the copper surface or any other means of application (103). A drying/precure step is next to remove volatile components and make the uncured via fill composition more rigid. This enables the composition to stay in the vias. Electrical continuity is needed to ensure current flow over the plug, and ensures plating over. After drying/precure step, residues left on the surface may be removed by a scrubbing step. The scrubbing step removes vehicle at the surface of the conductive particles found in the plug and ensures good electrical contact. This lapping or scrubbing step has an additional purpose aside from eliminating the excess plug residue, it activates the surface by smearing the soft silver particles. A cure step is then required to cross-link the organic vehicle and substantially eliminate the solvent. After cure, the shrinkage is small so that the conductive plug remains in contact with the thin copper foil.

(FIG. 2d) Conventional print & etch process steps (204) are then performed as discussed in the process hereinabove.

(FIG. 2e) Followed by an electroless Cu plating step (205).

The invention is now illustrated by examples of certain representative embodiments thereof, wherein all percentages are by weight unless otherwise indicated.

EXAMPLES

TABLE I

| Epoxy Vehicle Compositions | | | | |
|---|---|---|---|---|
|  | A | B | C | D |
| Shell Epon ® 862 | 80.0 | 80.0 | 78.0 | 89.2 |
| Heloxy ® 62 | 20.0 | 5.0 | — | — |
| Heloxy ® 505 | — | 15.0 | 17.0 | — |
| SKW Dyhard ® RU-100 | 7.0 | 7.0 | 7.0 | 6.3 |
| SKW Dyhard ® RU-300 | 3.0 | 3.0 | 3.0 | — |
| SKW Dyhard ® RU-500 | — | — | — | 2.7 |
| Dibutyl Carbitol | — | — | 2.0 | 1.8 |

*manufacturer information and chemical names supplied in Glossary

TABLE II

| Epoxy Silver Via Fill Paste Compositions | | | | | | |
|---|---|---|---|---|---|---|
|  | 1 | 2 | 3 | 4 | 5 | 6 |
| P-3032 (washed) | 9.2 | 9.0 | — | — | — | — |
| K-003L | — | — | 3.6 | 10.1 | 40.9 | 36.8 |
| P-3011 | 78.6 | 79.0 | 32.0 | 35.4 | 40.9 | 36.8 |
| Conduct-O-Fil Vehicle | — | — | 53.0 | 45.5 | 9.2 | 18.9 |
| A | 7.1 | 8.0 | — | — | — | — |
| B | — | — | 9.1 | — | — | — |
| C | — | — | — | 8.0 | — | — |
| D | — | — | — | — | 5.9 | 5.6 |
| Dimethyl Phthalate | 5.1 | 4.0 | — | — | — | — |
| Diethylene glycol dibutyl ether | — | — | 2.3 | 1.0 | 3.1 | 2.8 |
|  | Slow Cure | Slow Cure | Low Cond. | Low Cond. | Good Cond. | Exc. Cond. |
|  | Cracks | Cracks | Gritty | Less Gritty | Fast Cure | Fast Cure |
|  | Poor Cond. | Poor Cond. | Slow Cure | Slow Cure | Good Print | Exc. Print |
|  | — | — | No Cracks | No Cracks | No Cracks | No Cracks |

EXAMPLE 1 (COMPARATIVE)

A conductive via fill plug composition was prepared with 87.8 percent silver, with just enough flake silver to keep the spherical silver from settling out during storage. Vehicle is 7.1%, with 5% solvent. It utilizes a relatively slow cure accelerator. It also uses chain terminators that are somewhat volatile. These materials' volatility permits vapor to escape particularly during the high temperature curing steps. This is undesirable because these materials are known to cause skin irritation. Conductive phase content is relatively low, and viscosity is relatively high.

This material was tested as a conductive via plug material in 47 and 62 mil thick PWB, with vias of 30 and 35 mils. The test circuit was a board with a 2 inch square grid containing an array of 121 (11×11) 30 or 35 mil vias. Vias were connected together by 10 mil conductor traces in "daisy chain" fashion. Total conductor length was 26 inches, or 2600 squares. The paste was printed through a four mil thick brass stencil, manipulating squeegee speed and pressure so that the vias were 90 to 100 percent filled with paste. A 100 degree, 15 minute dry step was then used to keep the paste in the vias from being forced out when the second print was made on the other side. Parts were cured at 200 degrees for 5 minutes. Resistance of the vias was measured using a Fluke ohmmeter. Resistance was typically over 1000 ohms. We have achieved good hardness with this cure cycle. The hardness was measured by using a needle tip ground to a 12 mil diameter tip. The tip was rested on a surface of cured epoxy silver composition while applying a 1 kg weight to the needle. If no indentation occurred, hardness was described as "good". This material cures very slowly.

EXAMPLE 2 (COMPARATIVE)

This Example uses the same components as the formula in Example 1 except that it is slightly higher in vehicle solids than in Example 1. Organic content is 8% and silver content is 88%. Parts were printed and evaluated as in Example 1. The problems with slow cure, cracks, and poor conductivity persist. Thus, problems of cracking do not appear very sensitive to organic content in the cured film.

EXAMPLE 3

A conductive via fill plug composition was prepared with 91% conductive phase, with just enough flake silver to keep the spherical silver from settling out during storage. The Potter industries Cu/Ag (Ag clad Cu particles) is a 45 micron effective average diameter powder; actual shapes are quite irregular, but not flat along one axis, as is the flake silver. It is present at 53.5% of the composition. Vehicle is 9.1% with 2.3% solvent. It utilizes a relatively slow cure accelerator. It uses chain terminators that are somewhat volatile; however, the most volatile species is present as only 5% of the vehicle, with a high molecular weight material (Heloxy#505 from SKW, Inc.) at 15%. Thus, there is less tendency for vapor to escape during the high temperature curing steps. Both conductive and vehicle phases are relatively high at the expense of solvent content, and viscosity is relatively high. The high vehicle solids after curing reduces the conductivity.

This material was tested as a via plug material in 47 and 62 mil thick PWB, with vias of 30 or 35 mils. The test circuit was a board with a 2 inch square grid containing an array of 121 (11×11) 30 or 35 mil vias. Vias were connected together by 10 mil conductor traces in "daisy chain" fashion. Total conductor length was 24 inches, or 2400 squares. The paste was printed through a four mil thick brass stencil so that the vias were 90 to 100% filled with paste. A 100 degree, 15 minute dry step was then used to keep the paste in the vias from being forced out when the second print was made on the other side. Parts were cured at 200 degrees for 5 minutes. Resistance of the vias was measured using a Fluke ohmmeter. Resistance was typically over 1000 ohms.

This material cures very slowly. The large particles of the Potter industries 45 micron powder eliminated cracking in the body of the via plug. However, the high organic solids content did not permit adequate particle-particle contact to develop adequate conductivity.

EXAMPLE 4

This example contains 91% conductive phase, with enough flake silver (10.1%) to keep the spherical silver (35.4%) from settling out during storage. The paste also contains 45.5% Potter Industries Cu/Ag (Ag clad Cu particles), a 45 micron effective average diameter powder. Actual shapes are quite irregular, but not flat along one axis, as is the flake silver. Organic solids is 9.1% with 2.3% solvent. It still utilizes the relatively slow cure accelerator UR-300 from SKW. It uses a chain terminator that is very slightly volatile; The relatively high molecular weight material (Heloxy#505 from SKW, Inc.) at 17% of organic non-volatiles. Thus, there is much less tendency for any vapor to escape during the high temperature curing steps. Both conductive and vehicle phases are relatively high at the expense of solvent content, and viscosity is relatively high. The high vehicle solids after curing reduces the conductivity.

This material was tested in a via plug material in 47 and 62 mil thick PWB, with vias of 30 and 35 mils. The test circuit was a board with a 2 inch square grid containing an array of 121 (11×11) 30 or 35 mil vias. Vias were connected together by 10 mil conductor traces in "daisy chain" fashion. Total conductor length was 24 inches, or 2400 squares. The paste was printed through a four mil thick brass stencil so that the vias were 90 to 100% filled with paste. A 100 degree, 15 minute dry step was then used to keep the paste in the vias from being forced out when the second print was made on the other side. Parts were cured at 200 degrees for 5 minutes. Resistance of the vias was measured using a Fluke ohmmeter. Resistance was typically over 1000 ohms.

This material cures very slowly (see preceding paragraph). The large particles of the Potter Industries 45 micron powder eliminated cracking in the body of the via plug. However, the high organic solids content did not permit adequate particle-particle contact to develop acceptable conductivity.

EXAMPLE 5

This example contains 91% conductive phase, with equal amounts of flake silver (40.9%) and spherical silver (40.9%). The paste also contains 9.2% Potter Industries Cu/Ag (Ag clad Cu particles, see Example 3 for the description). Vehicle is 5.9% with 3.1% solvent. It utilizes the relatively fast cure accelerator UR-500 from SKW. The chain terminators used in the previous Examples were eliminated. Vehicle nonvolatile phase has been substantially reduced, and viscosity is considerably lower. The lower vehicle solids after curing greatly improves the conductivity. Conductivity as low as 20 ohms in the via pattern below were achieved, versus hundreds or thousands of ohms in previous materials. No cracking was observed in the body of vias. The lower concentration of 45 micron particles eliminated the "gritty" appearance of the paste.

This material was tested as a via plug material in 47 and 62 mil thick PWB, with vias of 30 to 35 mils. The test circuit was a board with a 2 inch square grid containing an array of 121 (11×11) 30 or 35 mil vias. Vias were connected together by 10 mil conductor traces in "daisy chain" fashion. Total conductor length was 24 inches, or 2400 squares. The paste was printed through a four mil thick brass stencil so that the vias were about 90% filled with paste. A 100 degree, 15 minute dry step was then used to keep the paste in the vias from being forced out when the other side was being printed.

Parts could be cured as low as 135° C. for 30 minutes. This is a significant advantage since the PWB itself is degraded by high temperatures. Typical cure cycles were 150 degrees for 15 minutes and 175 degrees for ten minutes. Good hardness by evident by curing as low as 135° for 30 minutes. Hardness was tested by applying force to a needle that had a tip ground to 12 mils diameter. The tip was rested on a surface of cured epoxy silver composition while applying a one kilogram weight. If no indentation occurred, hardness was described as "good", as was the case with this composition. Typical curing conditions were ten minutes at 175° C., or at 150° C. for 15 minutes. The large particles of the Potter Industries 45 micron powder eliminated cracking in the body of the via plug; the lower organic solids content permit enhanced particle-particle contact to develop excellent conductivity. Lower organic solids also permitted higher solids loading with suitable viscosity for via filling.

Resistance of the vias was measured using a Fluke ohmmeter. Resistance was typically around 20 ohms. The large particles of the Potter industries 45 micron powder eliminated cracking in the body of the via plug; the high organic solids content enhanced particle-particle contact to develop greatly improved conductivity.

EXAMPLE 6

This example contained 92.6% conductive phase, with equal amounts of flake silver (36.8%) and spherical silver (36.8%). The paste also contained 18.9% Potter Industries Cu/Ag (Ag clad Cu particles, see Example 3 for the description). Organic solids are 5.6% with 2.8% solvent. It utilizes the fast cure accelerator UR-500 from SKW. As in Example 5, the chain terminators used in Examples 1 to 4 are eliminated. Thus, vehicle nonvolatile phase has been substantially reduced. Solvent replaced the chain terminators. This causes viscosity to be considerably lower. This Example has a higher amount of the 45 micron Potter Industries powder. This improved the conductivity somewhat over the performance of Example 5.

This material was tested as a via plug material in 47 and 62 mil thick PWB, with vias of 30 and 35 mils. The test circuit was a board with a 2 inch square grid containing an array of 121 (11×11) 30 or 35 mil vias. Vias were connected together by 10 mil conductor traces in "daisy chain" fashion. Total conductor length was 24 inches, or 2400 squares. The paste was printed through a four mil thick brass stencil so that the vias were 90% or more filled with paste. A 100 degree, 15 minute dry step was then used to keep the paste in the vias from being forced out when the second print was made on the other side. Resistance of the vias was measured using a Fluke ohmmeter.

The low vehicle solids after curing greatly improves the conductivity. Resistance as low as 6 ohms in the via pattern below were achieved, better than any of the previous materials. No cracking was observed in the body of the vias. The lower concentration of 45 micron particles vs. example 4 eliminated the "gritty" appearance of the paste.

This material cures readily at well below 200°. Good hardness was achieved with as low as 135°, after 30 minutes cure. Hardness was tested by applying force to a needle that had a tip ground to 12 mils diameter. The tip was rested on a surface of cured epoxy silver composition while applying pressure. If no indentation occurred, hardness was described as "good". Typical curing conditions were ten minutes at 175° C.; 150° C. for 15 minutes is also used. The large particles of the Potter Industries 45 micron powder eliminated cracking in the body of the via plug; the lower organic solids content permit enhanced particle-particle contact to develop excellent conductivity. Low organic solids also permitted higher solids loading with suitable viscosity for via filling.

EXAMPLE 7

This example, employed a copper clad FR-4 8 mils thick with 1 Oz copper on each side. The substrate 12 by 18 inches was drilled with holes 10 mils of diameter. The pattern employed was a "daisy chain" with 121 (11×11 array) holes connected by a 10 mils wide conductor trace. The total conductor length was about 2400 squares long. The experimental conductive via plug composition of Example 5 was employed. The process is summarized as follows:

Apply the paste directly onto the surface with a rubber squeegee (80 durometer)

Cure for 5–10 mins at 130° C.

Clean and activate printed parts with the help of a conveyorized scrubber with Nylon brush Final cure 10 mins at 175° C.

Panel electroplate the board to seal the via plug with a copper flash of 200–300 micoinches and also to maximize the electrical contact with the signal layer. The following conditions were used:

dip in VersaClean™ 425 (Phosphoric acid)

a cascade rinse (DI water)

a micro-etch step of about 15µ inches (SureEtch™ 550, Potassium monopersulfate with sulfuric acid)

cascade rinse (DI water)

electrolytic plating with a bath from Lea Ronal ((Copper Gleam PCM Plus bath)—set at 10–15 Amps/ft$^2$ to yield about 200–300 micro inches of copper Print & etch the board to form the circuit:

micro-etched the panels laminate photoresist (Riston™ 9015)

expose the pattern (daisy chain connecting the vias)

develop the photoresist etch the copper strip away the photoresist

The entire daisy chain gave 3.2±0.2 Ohm (6 samples measured). To derive the actual plug resistivity, the conductor was taken into account, a copper trace 1.5 mil thick and 2400 squares long (about 2 Ohms overall). The total contribution of the 121 via plug was found to be around 1 Ohm, yielding for one plug a resistivity less than 10 mohm.

The copper sealing proved strong enough to withstand a solder float test at 288° C. for 10s and also a thermal cycle test from –65° C. to 125° C. for 100 cycles with conductivity variation less than 10%.

EXAMPLE 8

The conductive paste material of Example 5 was employed in this example. The process employed was essentially the same as in Example 7 except that a 4 mils thick stencil (Stainless steel) was used between the squeegee and the panel to minimize the paste residues. Holes on the stencil were 8 mils wider than that of the substrate. The paste was dried for 4 mins at 150° C. (the vehicle is in a b-stage so that it was still relatively soft) and removed the residues with one pass only through the conveyorized scrubber. The board was cured for 20 mins at 150° C. The plating and print & etch process steps that followed were identical to that ones already described in Example 7.

The results obtained are essentially identical to those obtained in example 7.

EXAMPLE 9

A copper clad FR-4 10 mils thick with ½ Oz copper and 18 by 24 inches wide was used. The boards were drilled (10,000 holes) with 10 mils holes diameter, yielding an aspect ration of 1:1. The holes were plugged with the paste of Example 6 by applying it directly onto the surface. The paste was then dried for 10 mins at 100° C.—a lower temperature than in example 2. This was done to eliminate the risk of cracking and blistering. At lower temperatures (<135° C.), the solvent is eliminated without curing the vehicle so that with a lower viscosity, the material finds plenty of time to adjust the slight volume change.

The residues were scrubbed away with a compress pad mounted into a conveyorized scrubber. The paste was cured for 15 mins at 150° C. and panel electroplated the board according to the procedure described in example 7. For the print & etch, a "daisy" chain pattern was employed with traces 50 mils wide. With the 5 panels that were processed, a consistent resistivity was measured which was around 170Ω+/−20Ω across the entire "daisy" chain, yielding less than 10 mΩ per plug after subtracting the contribution of the copper trace.

EXAMPLE 10

The same test vehicle as in example 7 and 8 and the paste of example 5 was tested. The process employed was essentially the same up as in example 8, i.e. drill, plug, dry, scrub and thermal cure. The test panels were printed and etched as in Examples 7 and 8 according to the same protocol described in example 7. To enhance the electrical contact, an electroless plating bath was employed from Shipley (full build electroless CP-71 bath) with a standard alkaline cleaner (Shipley 3320), cascade DI water rinse, micro-etch (SureEtch® 550) and DI rinse pre-cleaning steps. The panels were left for 2 hours (100 microinches plate rate) in the plating bath and then rinsed.

With respect to thermal shock and solder float, the results obtained were similar to those ones of examples 7 and 8.

GLOSSARY

Shell Epon® 862 supplied by Shell Oil Company, 1 Shell Plaza, P.O. Box 4320, Houston, Tex. (Bisphenol F/Epichlorohydrin Epoxy Resin).

Heloxy® 62 supplied by Shell Oil Company (O-Cresyl Glydicyl Ether).

Heloxy® 505 supplied by Shell Oil Company (Castor Oil Glycidyl Ether/Epichlorohydron).

SKW Dyhard® RU-100 supplied by SKW Chemical, Inc., 4651 Old Town Parkway, Suite 200, Marietta, Ga. 30068 (Dicyandiamide).

SKW Dyhard® RU-300 supplied by SKW Chemical, Inc., (Fenuron).

SKW Dyhard® RU-500 supplied by SKW Chemical, Inc., (Urea N',N'-(4-Methyl-M-Phenyline)bis[N',*].

Dibutyl Carbitol supplied by Union Carbide.

P-3032 supplied by E.I. du Pont de Nemours and Company, washed silver flake powder.

P-3011 supplied by E.I. du Pont de Nemours and Company, spherical silver with uniform particle size.

K-003L supplied by E.I. du Pont de Nemours and Company, silver flake powder.

Silver coated Cu supplied by Potter Industries Inc., 20 Waterview Blvd., Parsippany N.J. (Cu/Ag(45 m)).

Conduct-O-Fil SC32517 supplied by Potter industries, irregular shaped copper granules coated with 17% silver.

Epon 828 resin supplied by Shell Oil Company, epichlorohydrin resin.

VersaClean® 45 supplied by E.I. du Pont de Nemours and Company.

SureEtch® 550 supplied by E.I. du Pont de Nemours and Company.

CopperGleam supplied by Ronal.

Riston® 9015 supplied by E.I. du Pont de Nemours and Company.

We claim:

1. A method for forming electrically conductive vias between electrically functional layers separated by a dielectric layer comprising the sequential steps:

A. Forming via holes in a copper-clad substrate which separates electrically functional layers;
   B. Filling the via holes with a via fill composition comprising 85–93 wt % of a trimodal conductive mixture wherein the trimodal conductive mixture consists of particles of spherical silver, flake silver and silver-coated copper dispersed in an organic medium;
   C. Drying the composition;
   D. Removing residue from the surface of the substrate;
   E. Subjecting the filled substrate to heat;
   F. Preparing the surface of the filled substrate for plating;
   G. Plating the filled substrate by electrolytic flash;
   H. Preparing the surface of the plated substrate;
   I. Applying a photoresist to the prepared substrate;
   J. Exposing the photoresist to generate a pattern;
   K. Developing and removing the exposed photoresist;
   L. Etching the exposed copper;
   M. Stripping the remaining photoresist from the copper.

2. A method for forming electrically conductive vias between electrically functional layers separated by a dielectric layer comprising the sequential steps:

A. Forming via holes in a copper-clad substrate which separates electrically functional layers;
   B. Filling the via holes with a via fill composition comprising 85–93 wt % of a trimodal conductive mixture wherein the trimodal conductive mixture consists of particles of spherical silver, flake silver and silver-coated copper dispersed in an organic medium;
   C. Drying the composition;
   D. Removing residue from the surface of the filled substrate;
   E. Subjecting the filled substrate to heat;
   F. Preparing the surface of the plated substrate;
   G. Applying a photoresist to the prepared substrate;
   H. Exposing the photoresist to generate a pattern;
   I. Developing and removing the exposed photoresist;
   J. Etching the exposed copper;
   K. Stripping the remaining photoresist to bare the remaining copper;
   L. Plating the: surface of the bared copper by electroless plating.

3. The method of claims 1 or 2 wherein the method employed for filling via holes is selected from the group consisting of screen printing, stenciling, doctor blading, syringe or bladder printing.

* * * * *